(12) United States Patent
Pyun et al.

(10) Patent No.: US 10,650,773 B2
(45) Date of Patent: May 12, 2020

(54) POWER MANAGEMENT CIRCUIT AND DISPLAY DEVICE HAVING THE SAME

(71) Applicant: Samsung Display Co., Ltd., Yongin-si, Gyeonggi-do (KR)

(72) Inventors: Kihyun Pyun, Gwangmyeong-si (KR); Yu-chol Kim, Pyeongtaek-si (KR); Minyoung Park, Busan (KR); Min-soo Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/201,325

(22) Filed: Nov. 27, 2018

(65) Prior Publication Data

US 2019/0165675 A1 May 30, 2019

(30) Foreign Application Priority Data

Nov. 28, 2017 (KR) ........................ 10-2017-0160890

(51) Int. Cl.
*G09G 3/36* (2006.01)
*H02M 3/157* (2006.01)
(Continued)

(52) U.S. Cl.
CPC ............ *G09G 3/3696* (2013.01); *G09G 3/36* (2013.01); *G09G 3/3648* (2013.01); *H02M 3/157* (2013.01); *H02M 3/158* (2013.01); *H03L 7/0891* (2013.01); *H03L 7/099* (2013.01); *G02F 1/13306* (2013.01); *G02F 1/136286* (2013.01);
(Continued)

(58) Field of Classification Search
CPC ............... H02M 3/157; H02M 3/3376; H02M 2001/0045; G09G 2330/021; G09G 3/36; G09G 3/3648; G09G 3/3696; G09G 2330/028; G09G 2320/064; G09G 3/3406;
(Continued)

(56) References Cited

U.S. PATENT DOCUMENTS 8,884,598 B2  11/2014  Harrison
8,896,284 B2  11/2014  Fan
(Continued)

FOREIGN PATENT DOCUMENTS

KR  10-0927649 B1  11/2009
KR  10-1715673 B1  3/2017
KR  10-2017-0092118 A  8/2017

*Primary Examiner* — Sanjiv D. Patel
(74) *Attorney, Agent, or Firm* — Lewis Roca Rothgerber Christie LLP

(57) ABSTRACT

A display device includes a display panel, and a power management circuit including a switching regulator for supplying a power in a discontinuous conduction mode or in a continuous conduction mode, and a sensing circuit for sensing whether the switching regulator is operated in the discontinuous conduction mode, the switching regulator including a comparator for monitoring the supplied power, and an RS latch for receiving an output signal from the comparator, and the sensing circuit including a phase lock loop circuit for generating a first clock signal, a phase delay circuit for generating a second clock signal having a phase delayed from the first, and a determination circuit for outputting a first value when a pulse width of the output signal from the RS latch is small, and for outputting a second value when the pulse width of the output signal from the RS latch is not small.

20 Claims, 8 Drawing Sheets

(51) Int. Cl.
  *H02M 3/158* (2006.01)
  *H03L 7/099* (2006.01)
  *H03L 7/089* (2006.01)
  *G02F 1/133* (2006.01)
  *G02F 1/1362* (2006.01)
  *H02M 1/00* (2006.01)
(52) U.S. Cl.
  CPC .............. *G09G 2330/021* (2013.01); *H02M 2001/0032* (2013.01)
(58) Field of Classification Search
  CPC .............. G09G 5/008; G09G 2330/02; G09G 2310/0286
  See application file for complete search history.

(56) References Cited

U.S. PATENT DOCUMENTS

| | | | |
|---|---|---|---|
| 2010/0127672 A1* | 5/2010 | Chen | G09G 3/3406 323/222 |
| 2010/0220039 A1* | 9/2010 | Park | H02M 3/1588 345/76 |
| 2011/0012881 A1* | 1/2011 | Chang | G09G 5/18 345/211 |
| 2011/0156606 A1* | 6/2011 | Hwang | H02M 1/44 315/186 |
| 2014/0118414 A1* | 5/2014 | Seo | G09G 3/3208 345/690 |
| 2015/0280557 A1* | 10/2015 | Xue | H02M 3/156 323/271 |
| 2017/0222569 A1 | 8/2017 | Choi et al. | |

* cited by examiner

POWER MANAGEMENT CIRCUIT AND DISPLAY DEVICE HAVING THE SAME

CROSS-REFERENCE TO RELATED APPLICATION

This application claims priority to and the benefit of Korean Patent Application No. 10-2017-0160890, filed on Nov. 28, 2017, the content of which in its entirety is herein incorporated by reference.

BACKGROUND

1. Field

The present disclosure relates to a power management circuit and a display device having the same.

2. Description of the Related Art

A power management circuit is a basic configuration that drives various electronic devices. In recent years, as the use of mobile devices increases, and as energy management is useful, the demand for a suitable direct current-to-direct current converter (DC-to-DC converter) is on the rise.

Accordingly, a switching converter is widely used as the DC-to-DC converter because the switching converter includes an inductor to reduce or minimize power consumption and to easily obtain a target voltage.

As the switching converter, a buck converter that steps down a DC voltage to a lower DC voltage, or a booster converter that steps up the DC voltage to a high DC voltage, may be used.

The DC-to-DC converter includes a low dropout regulator with linear regulators.

In recent years, the regulators are integrated in the power management circuit (e.g., PMIC) to provide an optimized power for load devices.

In addition, recent power management circuits select the discontinuous conduction mode (DCM) and the continuous conduction mode (CCM) to reduce or minimize power consumption as needed.

SUMMARY

The present disclosure provides a power management circuit capable of monitoring a power to sense whether the power is provided in a discontinuous conduction mode or in a continuous conduction mode.

The present disclosure provides a display device having the power management circuit.

Embodiments of the inventive concept provide a display device including a display panel, and a power management circuit including a switching regulator for supplying a power to the display panel in a discontinuous conduction mode or in a continuous conduction mode, and a sensing circuit for sensing whether the switching regulator is operated in the discontinuous conduction mode, wherein the switching regulator includes a comparator for receiving and monitoring the supplied power, and an RS latch for receiving an output signal from the comparator as a reset signal, and wherein the sensing circuit includes a phase lock loop circuit for generating a first clock signal, a phase delay circuit for receiving the first clock signal and generating a second clock signal having a phase delayed from a phase of the first clock signal, a first D flip-flop for receiving an output signal from the RS latch and the first clock signal, and for operating at a rising edge, a second D flip-flop for receiving an output signal from the first D flip-flop and the first clock signal, and for operating at a falling edge, a third D flip-flop for receiving the output signal from the RS latch and the second clock signal, and for operating at a rising edge, a fourth D flip-flop for receiving an output signal from the third D flip-flop and the first clock signal, and for operating at a falling edge, an exclusive OR circuit for receiving an output signal from the second D flip-flop and an output signal from the fourth D flip-flop, a fifth D flip-flop for receiving an output signal from the exclusive OR circuit and a third clock signal having a frequency that is lower than a frequency of the first clock signal, a plurality of registers for sequentially storing signals output from the fifth D flip-flop, and a control circuit for controlling the phase lock loop circuit based on data stored in the registers.

The sensing circuit may further include a decoder to control the registers.

The RS latch may be configured to receive the first clock signal as a set signal.

A frequency of the output signal from the RS latch may be equal to the frequency of the first clock signal.

The phase lock loop circuit may include a voltage controlled oscillator, a divider for receiving an output signal from the voltage controlled oscillator, a phase frequency detector for receiving an output signal from the divider, a charge pump for receiving an output signal from the phase frequency detector, and a low pass filter for applying only a frequency band of an output signal of the charge pump to the voltage controlled oscillator.

The control circuit may be configured to apply a control signal to the divider.

The control circuit may be configured to determine that the switching regulator is operated in the discontinuous conduction mode when each of the registers stores the data having a high value, and may be configured to determine that the switching regulator is operated in the continuous conduction mode when each of the registers stores the data having a low value.

When the control circuit determines that the switching regulator is operated in the discontinuous conduction mode, the frequency of the first clock signal may increase.

The control circuit may be configured to apply a control signal to the phase delay circuit to control a difference in phase between the first clock signal and the second clock signal.

The output signal of the RS latch may have a pulse width that is smaller than a difference in phase between the first clock signal and the second clock signal in the discontinuous conduction mode.

Other embodiments of the inventive concept provide a power management circuit including a switching regulator for supplying a power to an external device in a discontinuous conduction mode or in a continuous conduction mode, and a sensing circuit for sensing whether the switching regulator is operated in the discontinuous conduction mode wherein the switching regulator includes a comparator for receiving the supplied power to feedback the supplied power, and an RS latch for receiving an output signal from the comparator as a reset signal, and wherein the sensing circuit includes a phase lock loop circuit for generating a first clock signal, a phase delay circuit for receiving the first clock signal, and for generating a second clock signal having a phase delayed from a phase of the first clock signal, a first D flip-flop for receiving an output signal from the RS latch and the first clock signal, and operating at a rising edge, a second D flip-flop for receiving an output signal from the first D flip-flop and the first clock signal, and for operating at a falling edge, a third D flip-flop for receiving the output signal from the RS latch and the second clock signal, and for operating at a rising edge, a fourth D flip-flop for receiving an output signal from the third D flip-flop and the first clock signal, and for operating at a falling edge, an exclusive OR circuit for receiving an output signal from the second D flip-flop and an output signal from the fourth D flip-flop, a fifth D flip-flop for receiving an output signal from the exclusive OR circuit and a third clock signal having a frequency that is lower than a frequency of the first clock signal, a plurality of registers for sequentially storing signals output from the fifth D flip-flop, and a control circuit for controlling the phase delay circuit based on data stored in the registers.

The sensing circuit may further include a decoder to control the registers.

The RS latch may be configured to receive the first clock signal as a set signal.

A frequency of the output signal from the RS latch may be equal to the frequency of the first clock signal.

The phase lock loop circuit may include a voltage controlled oscillator, a divider for receiving an output signal from the voltage controlled oscillator, a phase frequency detector for receiving an output signal from the divider, a charge pump for receiving an output signal from the phase frequency detector, and a low pass filter for applying only a frequency band of an output signal of the charge pump to the voltage controlled oscillator.

The control circuit may be configured to apply a control signal to the divider.

The control circuit may be configured to determine that the switching regulator is operated in the discontinuous conduction mode when each of the registers stores the data having a high value, and may be configured to determine that the switching regulator is operated in the continuous conduction mode when each of the registers stores the data having a low value.

When the control circuit determines that the switching regulator is operated in the discontinuous conduction mode, the frequency of the first clock signal may increase.

The control circuit may be configured to apply a control signal to the phase delay circuit to control a difference in phase between the first clock signal and the second clock signal.

Still other embodiments of the inventive concept provide a display device including a display panel, and a power management circuit including a switching regulator for supplying a power to the display panel in a discontinuous conduction mode or in a continuous conduction mode, and a sensing circuit for sensing whether the switching regulator is operated in the discontinuous conduction mode, wherein the switching regulator includes a comparator for receiving and monitoring the supplied power, and an RS latch for receiving an output signal from the comparator as a reset signal, and wherein the sensing circuit includes a phase lock loop circuit for generating a first clock signal, a phase delay circuit for receiving the first clock signal, and for generating a second clock signal having a phase delayed from a phase of the first clock signal, and a determination circuit for receiving the first clock signal, the second clock signal, and an output signal from the RS latch, for outputting a first value when a pulse width of the output signal from the RS latch is smaller than a reference value, and for outputting a second value, which is different from the first value, when the pulse width of the output signal from the RS latch is greater than the reference value.

According to the above, when the discontinuous conduction mode is sensed, a power efficiency of the display device may be improved by performing a frequency modulation on the clock signal.

In addition, the power is supplied to the display panel at an optimized frequency, and thus heat generated by the power management circuit of the display device may be reduced.

Further, because the DC-to-DC converter performs the frequency modulation rather than using a fixed frequency, defects caused by radio interference in the display device may be improved due to a frequency distribution characteristic.

BRIEF DESCRIPTION OF THE DRAWINGS

The above and other aspects of the present disclosure will become readily apparent by reference to the following detailed description when considered in conjunction with the accompanying drawings wherein.

DETAILED DESCRIPTION

Figure 1:
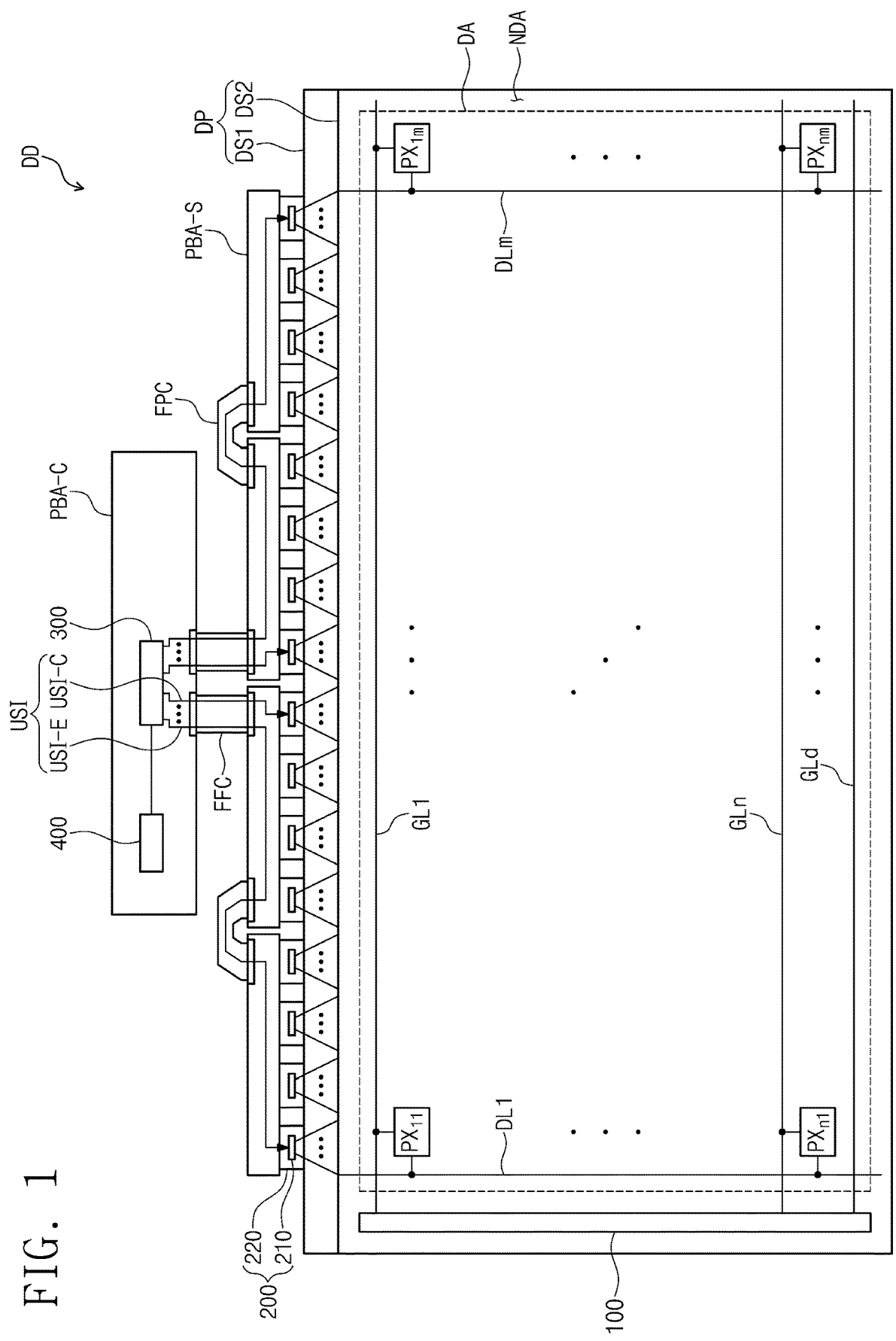
FIG. 1 is a plan view showing a display device according to an embodiment of the present disclosure.

Features of the inventive concept and methods of accomplishing the same may be understood more readily by reference to the following detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present invention.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
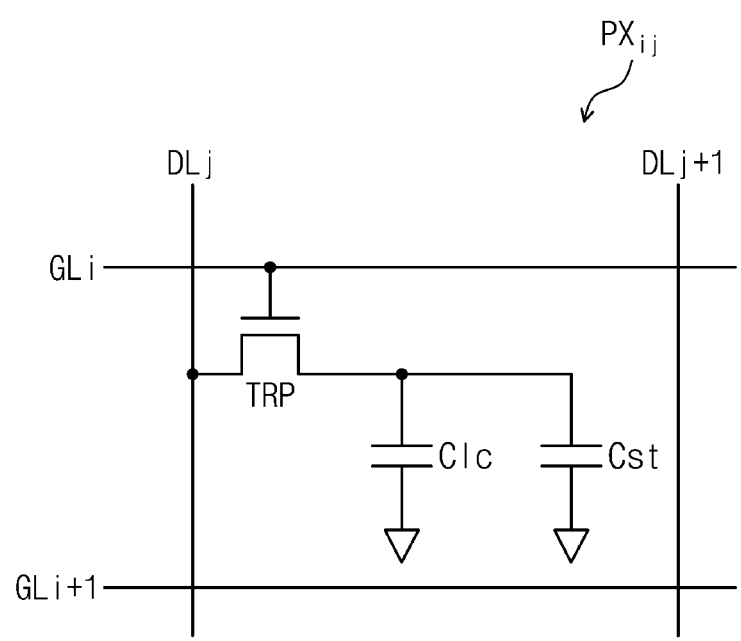
FIG. 2 is an equivalent circuit diagram showing a pixel according to an embodiment of the present disclosure.
Figure 3:
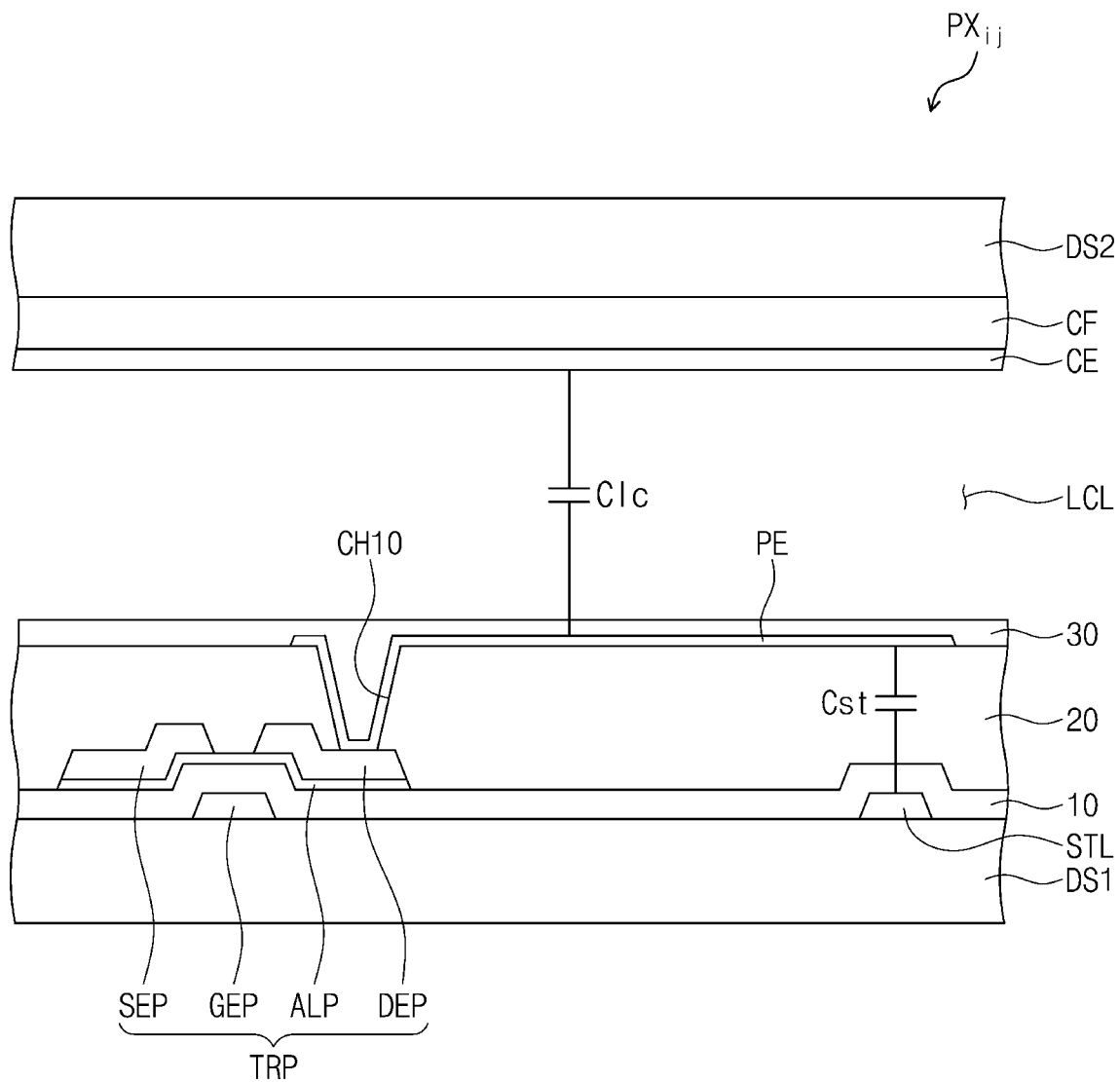
FIG. 3 is a cross-sectional view showing a pixel according to an embodiment of the present disclosure.

FIG. 1 is a plan view showing a display device DD according to an embodiment of the present disclosure. FIG. 2 is an equivalent circuit diagram showing a pixel PX according to an embodiment of the present disclosure. FIG. 3 is a cross-sectional view showing the pixel PX according to an embodiment of the present disclosure.

Referring to FIG. 1, the display device DD includes a display panel DP, a gate driving circuit 100, a data driving circuit 200, a signal controller 300, and a power management circuit 400.

The display panel DP may be one of various display panels, such as a liquid crystal display panel, an organic light emitting display panel, an electrophoretic display panel, an electrowetting display panel, etc. In the present embodiment, a liquid crystal display panel will be described as the display panel DP. Further, it should be noted that a liquid crystal display device including the liquid crystal display panel may further include a polarizer and a backlight unit, according to embodiments of the present disclosure.

The display panel DP includes a first substrate DS1, a second substrate DS2 spaced apart from the first substrate DS1, and a liquid crystal layer LCL interposed between the first substrate DS1 and the second substrate DS2 (e.g., see FIG. 3). When viewed in a plan view, the display panel DP includes a display area in which a plurality of pixels $PX_{11}$ to $PX_{nm}$ is arranged, and a non-display area NDA surrounding the display area DA.

The display panel DP includes a plurality of gate lines GL1 to GLn located on the first substrate DS1 and a plurality of data lines DL1 to DLm located on the first substrate DS1 to cross the gate lines GL1 to GLn. The gate lines GL1 to GLn are connected to the gate driving circuit 100. The data lines DL1 to DLm are connected to the data driving circuit 200. FIG. 1 shows some gate lines among the gate lines GL1 to GLn and some data lines among the data lines DL1 to DLm. In addition, the display panel DP may further include a dummy gate line GLd located in the non-display area NDA of the first substrate DS1.

FIG. 1 shows some pixels among the pixels $PX_{11}$ to $PX_{nm}$. Each of the pixels $PX_{11}$ to $PX_{nm}$ is connected to a corresponding gate line among the gate lines GL1 to GLn and a corresponding data line among the data lines DL1 to DLm. However, the dummy gate line GLd is not connected to the pixels $PX_{11}$ to $PX_{nm}$.

The pixels $PX_{11}$ to $PX_{nm}$ are grouped into a plurality of groups depending on colors displayed thereby. Each of the pixels $PX_{11}$ to $PX_{nm}$ displays one of primary colors, for example. The primary colors include red, green, blue, and white colors, but they should not be limited thereto or thereby. The primary colors may further include various colors, such as yellow, cyan, magenta, etc.

The gate driving circuit 100 and the data driving circuit 200 receive control signals from the signal controller 300 (e.g., a timing controller). The signal controller 300 is mounted on a first circuit board PBA-C and receives a power from the power management circuit 400. The first circuit board PBA-C may be, but is not limited to, a printed board assembly (PBA). The power management circuit 400 may be, but is not limited to, a power management integrated circuit (PMIC). The power management circuit 400 will be described in detail with reference to FIG. 4.

The signal controller 300 receives image data and control signals from an external graphic controller. The control signals include a vertical synchronization signal that distinguishes frame periods from each other, a horizontal synchronization signal that distinguishes horizontal periods from each other (e.g., a row distinction signal), a data enable signal maintained at a high level during a period in which data are output to indicate a data input period, and clock signals.

The gate driving circuit 100 generates gate signals GS1 to GSn based on a control signal (hereinafter, referred to as a "gate control signal") provided from the signal controller 300, and outputs the gate signals GS1 to GSn to the gate lines GL1 to GLn, respectively.

FIG. 1 shows one gate driving circuit 100 connected to left ends of the gate lines GL1 to GLn as an example. Alternatively, in the present embodiment, the display device may include two gate driving circuits, wherein one gate driving circuit of the two gate driving circuits is connected to the left ends of the gate lines GL1 to GLn, and the other gate driving circuit of the two gate driving circuits is connected to right ends of the gate lines GL1 to GLn. In addition, one gate driving circuit of the two gate driving circuits may be connected to odd-numbered gate lines of the gate lines GL1 to GLn, and the other gate driving circuit of the two gate driving circuits may be connected to even-numbered gate lines of the gate lines GL1 to GLn.

The data driving circuit 200 generates grayscale voltages corresponding to the image data provided from the signal controller 300 based on the control signal (hereinafter, referred to as a "data control signal") provided from the signal controller 300. The data driving circuit 200 outputs the grayscale voltages to the data lines DL1 to DLm as data voltages.

In the following descriptions, signals applied to the signal controller 300, the data driving circuit 200, and the pixels $PX_{11}$ to $PX_{nm}$ from the external graphic controller may be called data signals. The data signals may be changed or modified while being applied to the pixels $PX_{11}$ to $PX_{nm}$ from the external graphic controller, however, in conclusion, the data signals are signals including data used to display an image through the display area DA.

The data driving circuit 200 may include a driving chip 210 and a flexible circuit board 220 on which the driving chip 210 is mounted. Each of the driving chip 210 and the flexible circuit board 220 may be provided in a plural number. The flexible circuit board 220 electrically connects a second circuit board PBA-S to the first substrate DS1.

Some flexible circuit boards of the flexible circuit boards 220 are connected to one second circuit board PBA-S. Two second circuit boards PBA-S adjacent to each other are connected to each other by a flexible circuit board FPC.

The second circuit board PBA-S is connected to the first circuit board PBA-S by a flexible flat cable FFC.

Each of the driving chips 210 applies the data signals to corresponding data lines among the data lines DL1 to DLm.

The signal controller 300 and the driving chips 210 are connected to each other by interfaces USI. The interfaces USI include a center interface USI-C connecting the signal controller 300 to the driving chips 210 located near the signal controller 300, and a side interface USI-S connecting the signal controller 300 to the driving chips 210 located farther from the signal controller 300.

FIG. 1 shows a tape carrier package type data driving circuit 200 as an example. In the present embodiment, the driving chip 210 may be located on the non-display area NDA of the first substrate DS1 in a chip-on-glass (COG) manner.

FIG. 2 is the equivalent circuit diagram showing the pixel $PX_{ij}$ according to an embodiment of the present disclosure. FIG. 3 is a cross-sectional view showing the pixel $PX_{ij}$ according to an embodiment of the present disclosure. Each of the pixels $PX_{11}$ to $PX_{nm}$ shown in FIG. 1 may have the equivalent circuit diagram shown in FIG. 2.

Referring to FIG. 2, the pixel $PX_{ij}$ includes a pixel thin film transistor TRP (hereinafter, referred to as a "pixel transistor"), a liquid crystal capacitor Clc, and a storage capacitor Cst. In the following description, the term "transistor" used herein means a "thin film transistor." In the present embodiment, the storage capacitor Cst may be omitted.

The pixel transistor TRP is electrically connected to an i-th gate line GLi and a j-th data line DLj. The pixel transistor TRP outputs a pixel voltage corresponding to the data signal provided from the j-th data line DLj in response to the gate signal provided from the i-th gate line GLi.

The liquid crystal capacitor Clc is charged with the pixel voltage output from the pixel transistor TRP. An alignment of liquid crystal directors included in the liquid crystal layer LCL (refer to FIG. 3) is changed depending on an amount of electric charges charged in the liquid crystal capacitor Clc. A light incident to the liquid crystal layer either transmits through the liquid crystal layer or is blocked by the liquid crystal layer depending on the alignment of the liquid crystal directors.

The storage capacitor Cst is connected to the liquid crystal capacitor Clc in parallel. The storage capacitor Cst maintains the alignment of the liquid crystal directors (e.g., for a predetermined period).

Referring to FIGS. 2 and 3, the pixel transistor TRP includes a control electrode GEP connected to the i-th gate line GLi, an active layer ALP overlapped with the control electrode GEP, an input electrode SEP connected to the j-th data line DLj, and an output electrode DEP located to be spaced apart from the input electrode SEP.

The liquid crystal capacitor Clc includes a pixel electrode PE and a common electrode CE. The storage capacitor Cst includes the pixel electrode PE and a portion of a storage line STL overlapped with the pixel electrode PE.

The i-th gate line GLi and the storage line STL are located on a surface of the first substrate DS1. The control electrode GEP is branched from the i-th gate line GLi. The i-th gate line GLi and the storage line STL include a metal material, such as aluminum (Al), silver (Ag), copper (Cu), molybdenum (Mo), chromium (Cr), tantalum (Ta), titanium (Ti), and/or an alloy thereof. Each of the i-th gate line GLi and the storage line STL may have a multi-layer structure, for example, a structure including an titanium layer and a copper layer.

A first insulating layer 10 is located on the first substrate DS1 to cover the control electrode GEP and the storage line STL. The first insulating layer 10 includes at least one of an inorganic material and an organic material. The first insulating layer 10 may have a multi-layer structure, for example, a structure including a silicon nitride layer and a silicon oxide layer.

The active layer ALP is located on the first insulating layer 10 to overlap with the control electrode GEP. The active layer ALP includes a semiconductor layer and an ohmic contact layer.

The active layer ALP includes amorphous silicon or polysilicon. In addition, the active layer ALP may include a metal oxide semiconductor.

The output electrode DEP and the input electrode SEP are located on the active layer ALP. The output electrode DEP and the input electrode SEP are located to be spaced apart from each other. Each of the output electrode DEP and the input electrode SEP partially overlaps with the control electrode GEP.

FIG. 3 shows the pixel transistor TRP having a staggered structure, but the structure of the pixel transistor TRP should not be limited to the staggered structure. That is, the pixel transistor TRP may have a planar structure.

A second insulating layer 20 is located on the first insulating layer 10 to cover the active layer ALP, the output electrode DEP, and the input electrode SEP. The second insulating layer 20 provides an evenness/planar surface. The second insulating layer 20 includes an organic material.

The pixel electrode PE is located on the second insulating layer 20. The pixel electrode PE is connected to the output electrode DEP through a contact hole CH10 defined through the second insulating layer 20. An alignment layer 30 is located on the second insulating layer 20 to cover the pixel electrode PE.

A color filter layer CF is located on a surface of the second substrate DS2. A common electrode CE is located on the color filter layer CF. The common electrode CE is applied with a common voltage. The common voltage has a level that is different from that of the pixel voltage. An alignment layer may be located on the common electrode CE to cover the common electrode CE. Another insulating layer may be interposed between the color filter layer CF and the common electrode CE.

The pixel electrode PE and the common electrode CE, which are located to face each other such that the liquid crystal layer LCL is located between the pixel electrode PE and the common electrode CE, form the liquid crystal capacitor Clc. In addition, the pixel electrode PE and the portion of the storage line STL, which are located to face each other such that the first and second insulating layers 10 and 20 are located between the pixel electrode PE and the portion of the storage line STL, form the storage capacitor Cst. The storage line STL receives a storage voltage having a level that is different from that of the pixel voltage. The storage voltage may have the same level as that of the common voltage.

Meanwhile, the cross-section of the pixel $PX_{ij}$ shown in FIG. 3 is an example. Different from the structure of the pixel $PX_{ij}$ shown in FIG. 3, at least one of the color filter layer CF and the common electrode CE may be located on the first substrate DS1. In other words, the liquid crystal display panel according to the present embodiment may include a vertical alignment (VA) mode pixel, a patterned vertical alignment (PVA) mode pixel, an in-plane switching (IPS) mode pixel, a fringe-field switching (FFS) mode pixel, or a plane-to-line switching (PLS) mode pixel.

Figure 4:
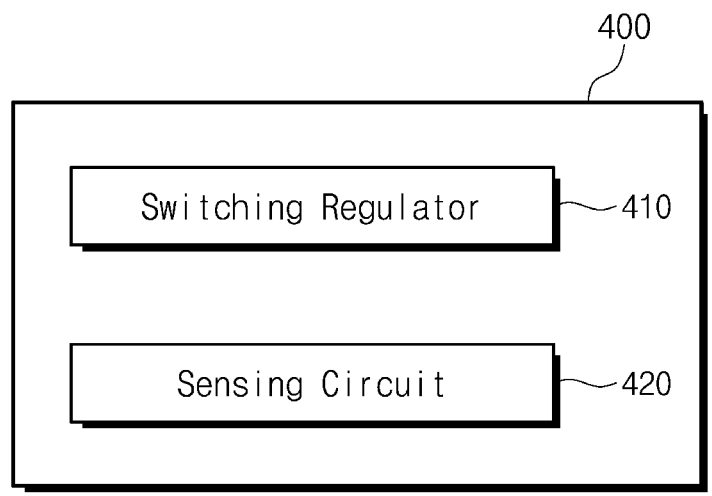
FIG. 4 is a block diagram showing a power management circuit shown in FIG. 1.
Figure 5:
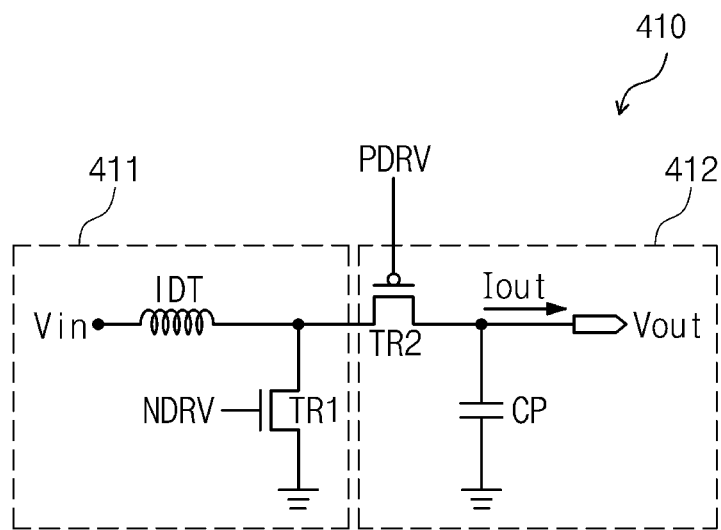
FIG. 5 is an equivalent circuit diagram showing some elements of a switching regulator shown in FIG. 4.
Figure 6:
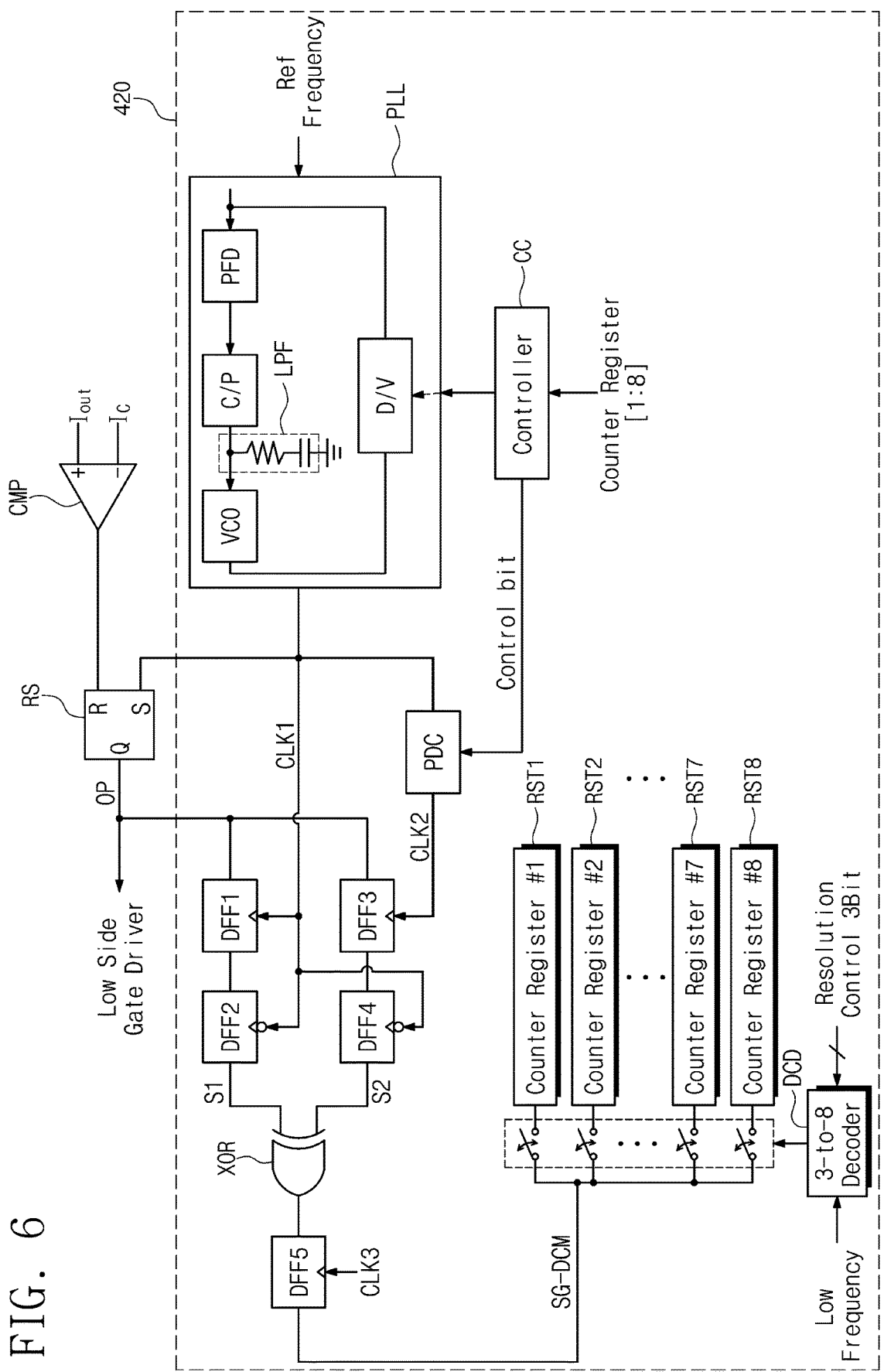
FIG. 6 is an equivalent circuit diagram showing a sensing circuit shown in FIG. 5.

FIG. 4 is a block diagram showing the power management circuit 400 shown in FIG. 1. FIG. 5 is an equivalent circuit diagram showing some elements of a switching regulator 410 shown in FIG. 4. FIG. 6 is an equivalent circuit diagram showing a sensing circuit 420 shown in FIG. 4.

The switching regulator 410 may supply a power to the display panel DP in a discontinuous conduction mode (DCM) or a continuous conduction mode (CCM).

Whether the switching regulator 410 supplies the power in the discontinuous conduction mode (DCM) or the continuous conduction mode (CCM) may be determined by a size of the display panel DP or by a load caused by an image displayed through the display panel DP.

As an example, in a case that the size of the display panel DP is small or the load caused by the image displayed through the display panel DP is small, a power efficiency when the switching regulator 410 supplies the power in the discontinuous conduction mode (DCM) may be superior than a power efficiency when the switching regulator 410 supplies the power in the continuous conduction mode (CCM). Accordingly, the power management circuit 400 may select an appropriate mode between the discontinuous conduction mode (DCM) and the continuous conduction mode (CCM) by taking into account the size of the display panel DP or the load caused by the image displayed through the display panel DP.

In order to select the appropriate mode, it is firstly suitable to sense which mode is currently used, between the discontinuous conduction mode (DCM) and the continuous conduction mode (CCM), and the sensing circuit 420 may perform the sensing operation.

Referring to FIG. 5, the switching regulator 410 includes a low side driver 411 and a high side driver 412. The low side driver 411 receives the power from an external source, and the high side driver 412 supplies the power converted by the switching regulator 410 to the display panel DP.

The low side driver 411 includes an inductor IDT and a first transistor TR1, and the high side driver 412 includes a second transistor TR2 and a capacitor CP.

The first transistor TR1 and the second transistor TR2 are turned on or turned off in response to driving signals PDRV and NDRV. A frequency of an output voltage Vout and an output current Iout is changed in response to a frequency of the driving signals PDRV and NDRV.

A current flowing through the inductor IDT may be regulated as the first and second transistors TR1 and TR2 are turned on or turned off. Here, assuming that the capacitor CP is sufficiently large, a pulsation of the output voltage Vout may be suppressed, and thus the output voltage Vout may be output in DC mode.

FIG. 6 shows a comparator CMP and an RS latch RS as the elements of the switching regulator 410, which are not shown in FIG. 5. According to another embodiment of the present disclosure, the comparator CMP and the RS latch RS may be provided not as the elements of the switching regulator 410, but as the elements included in the power management circuit 400.

In addition, referring to FIG. 6, the sensing circuit 420 includes a phase lock loop circuit PLL, a phase delay circuit PDC, a plurality of flip-flops DFF1 to DFF5, an exclusive OR circuit XOR, a plurality of registers RST1 to RST8, a decoder DCD, and a control circuit CC.

In the present embodiment, the comparator CMP and the RS latch RS are used to monitor the output current Iout output from the high side driver 412 of the switching regulator 410. The comparator CMP may be configured to include an operational amplifier (OP-amp).

The comparator CMP receives the output current Iout output from the high side driver 412 and a comparison current Ic.

The RS latch RS receives an output from the comparator CMP as a reset signal, and receives a first clock signal CLK1 output from the phase lock loop circuit PLL as a set signal.

In the present embodiment, the phase lock loop circuit PLL includes a voltage controlled oscillator VCO, a divider DN for receiving an output from the voltage controlled oscillator VCO, a phase frequency detector PFD for receiving an output from the divider DN, a charge pump C/P for receiving an output from the phase frequency detector PFD, and a low pass filter LPF for applying only a suitable frequency band of an output signal of the charge pump C/P to the voltage controlled oscillator VCO. The phase lock loop circuit PLL generates the first clock signal CLK1, and a frequency of the first clock signal CLK1 is controlled by the divider DN.

The phase lock loop circuit PLL applies the first clock signal CLK1 to the RS latch RS, a first D flip-flop DFF1, a second D flip-flop DFF2, a fourth D flip-flop DFF4, and a phase delay circuit PDC.

The phase delay circuit PDC receives the first clock signal CLK1 and generates a second clock signal CLK2 having a phase delayed from the first clock signal CLK1. The phase delay circuit PDC applies the second clock signal CLK2 to a third D flip-flop DFF3.

The first D flip-flop DFF1 receives the output signal OP from the RS latch RS and the first clock signal CLK1, and operates at a rising edge to apply its output signal to the second D flip-flop DFF2.

The second D flip-flop DFF2 receives the output signal from the first D flip-flop DFF1 and the first clock signal CLK1, and operates at a falling edge to apply its output signal S1 to the exclusive OR circuit XOR.

The third D flip-flop DFF3 receives the output signal OP from the RS latch RS and the second clock signal CLK2, and operates at a rising edge to apply its output signal to the fourth D flip-flop DFF4.

The fourth D flip-flop DFF4 receives the output signal from the third D flip-flop DFF3 and the first clock signal CLK1, and operates at a falling edge to apply its output signal S2 to the exclusive OR circuit XOR.

The exclusive OR circuit XOR receives the output signal S1 from the second D flip-flop DFF2 and the output signal S2 from the fourth D flip-flop DFF4, and applies an output signal, which is generated by performing a calculation operation, to a fifth D flip-flop DFF5.

The fifth D flip-flop DFF5 receives the output signal from the exclusive OR circuit XOR and a third clock signal CLK3 to generate a DCM count signal SG-DCM. The third clock signal CLK3 has a frequency that is less than a frequency of the first clock signal CLK1 or a frequency of the second clock signal CLK2.

In the present descriptions, a flip-flop circuit, a flip-flop unit, or a determination circuit may include the D flip-flops DFF1 to DFF5 and the exclusive OR circuit XOR.

The registers RST1 to RST8 sequentially store value of the DCM count signal SG-DCM. The sequential storing of the registers RST1 to RST8 is controlled by the decoder DCD. FIG. 6 shows eight registers RST1 to RST8 and a 3-bit decoder DCD controlling the eight registers RST1 to RST8 as an example, but the number of the registers RST1 to RST8 and the bits of the decoders should not be limited thereto or thereby.

The control circuit CC controls the phase lock loop circuit PLL or the phase delay circuit PDC based on the data stored in the registers RST1 to RST8. In detail, the control circuit CC applies a control signal to the divider DN of the phase lock loop circuit PLL to control the frequency of the first clock signal CLK1. In addition, the control circuit CC applies a control signal to the phase delay circuit PDC to control a difference in phase between the first clock signal CLK1 and the second clock signal CLK2.

Figure 7A:
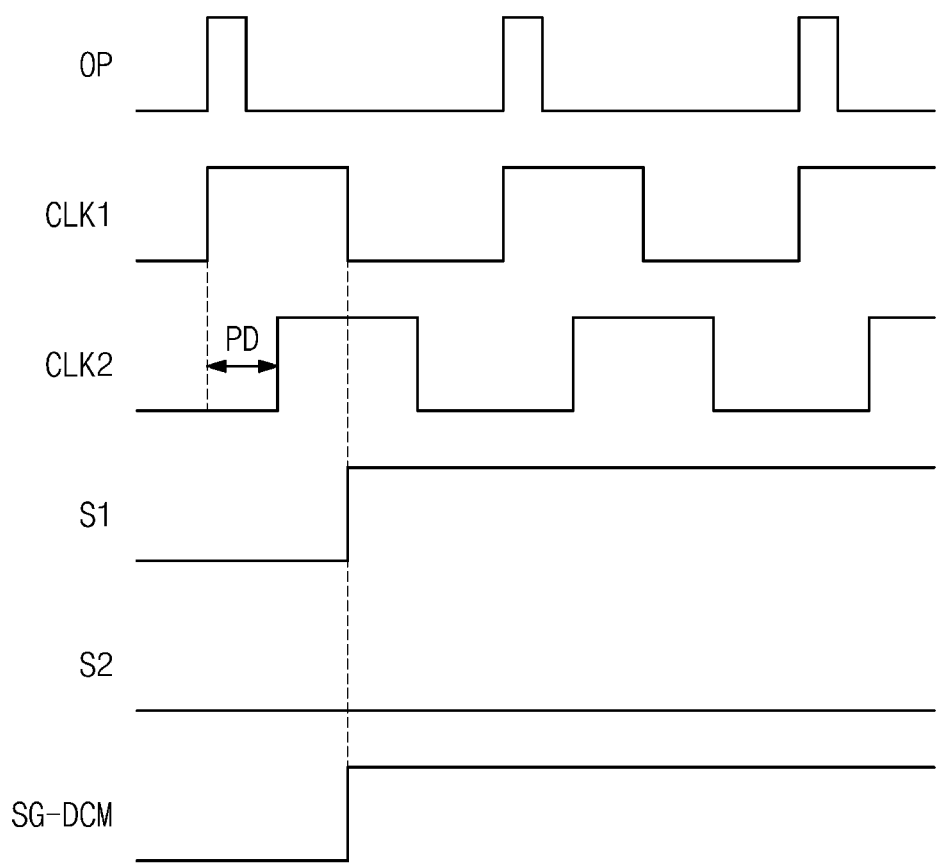
FIGS. 7A and 7B are timing diagrams showing an operation of the sensing circuit shown in FIG. 6.
Figure 7B:
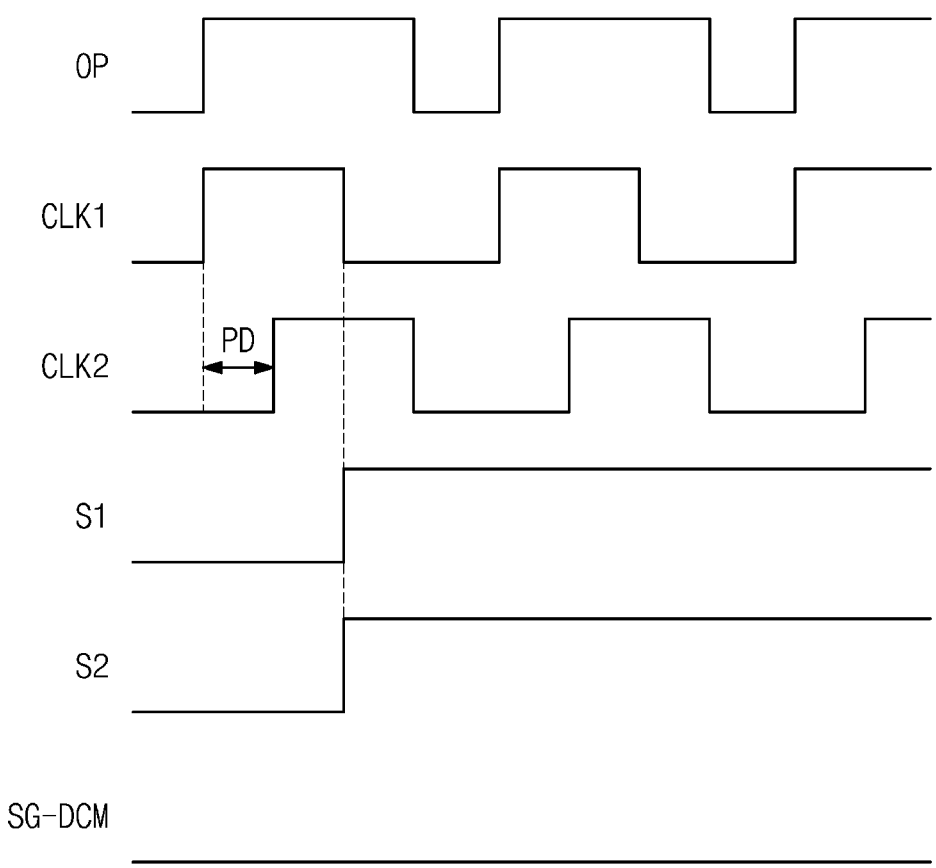

FIGS. 7A and 7B are timing diagrams showing an operation of the sensing circuit 420 shown in FIG. 6. The phase of the second clock signal CLK2 is delayed from the phase of the first clock signal CLK1. The frequency of the output signal OP of the RS latch RS may be equal to the frequency of the first clock signal CLK1 and the frequency of the second clock signal CLK2.

FIG. 7A is a timing diagram showing the operation of the sensing circuit 420 in the discontinuous conduction mode DCM.

Referring to FIG. 7A, the first D flip-flop DFF1 outputs the state of the output signal OP of the RS latch RS when the first clock signal CLK1 rises up, and the second D flip-flop DFF2 outputs the state of the output signal of the first D flip-flop DFF1 when the first clock signal CLK1 falls down. Accordingly, the output signal S1 of the second D flip-flop DFF2 becomes a high level state.

The third D flip-flop DFF3 outputs the state of the output signal OP of the RS latch RS when the second clock signal CLK2 rises up, and the fourth D flip-flop DFF4 outputs the state of the output signal of the third D flip-flop DFF3 when the first clock signal CLK1 falls down. Accordingly, the output signal S2 of the fourth D flip-flop DFF4 becomes or remains a low level state.

Accordingly, the output signal of the exclusive OR circuit XOR or the DCM count signal SG-DCM output from the fifth D flip-flop DFF5 becomes the high level state. The display device DD according to the present embodiment determines that the power management circuit 400 supplies the power in the discontinuous conduction mode DCM when the DCM count signal SG-DCM has a high level.

FIG. 7B is a timing diagram showing the operation of the sensing circuit 420 in the continuous conduction mode CCM.

Referring to FIG. 7B, the first D flip-flop DFF1 outputs the state of the output signal OP of the RS latch RS when the first clock signal CLK1 rises up, and the second D flip-flop DFF2 outputs the state of the output signal of the first D flip-flop DFF1 when the first clock signal CLK1 falls down. Accordingly, the output signal S1 of the second D flip-flop DFF2 becomes the high level state.

The third D flip-flop DFF3 outputs the state of the output signal OP of the RS latch RS when the second clock signal CLK2 rises up, and the fourth D flip-flop DFF4 outputs the state of the output signal of the third D flip-flop DFF3 when the first clock signal CLK1 falls down. Accordingly, the output signal S2 of the fourth D flip-flop DFF4 becomes the high level state different from that of FIG. 7A.

Accordingly, the output signal of the exclusive OR circuit XOR or the DCM count signal SG-DCM output from the fifth D flip-flop DFF5 maintains the low level state. The display device DD according to the present embodiment determines that the power management circuit 400 supplies the power in the continuous conduction mode CCM when the DCM count signal SG-DCM has the low level.

As shown in FIGS. 6, 7A, and 7B, when it is determined that the power management circuit 400 supplies the power in the discontinuous conduction mode DCM using the sensing circuit 420, the display device DD controls the low side driver 411 of the switching regulator 410 to control the frequency of the output of the power management circuit 400.

In the present embodiment, the phase difference PD between the first clock signal CLK1 and the second clock signal CLK2 may be greater than a pulse width of the output signal OP of the RS latch RS in the discontinuous conduction mode DCM. This is because the DCM count signal SG-DCM has the same value both in the continuous conduction mode CCM and in the discontinuous conduction mode DCM in the case that the phase difference PD between the first clock signal CLK1 and the second clock signal CLK2 is smaller than the pulse width of the output signal OP of the RS latch RS in the discontinuous conduction mode DCM.

Figure 8A:
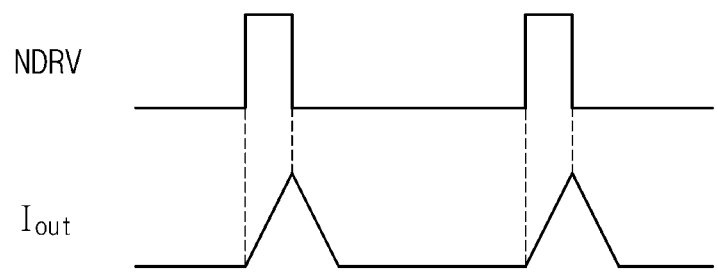
FIG. 8A is a waveform diagram showing waveforms of a control signal provided to a low side driver and an output current output from a high side driver in a discontinuous conduction mode.
Figure 8B:
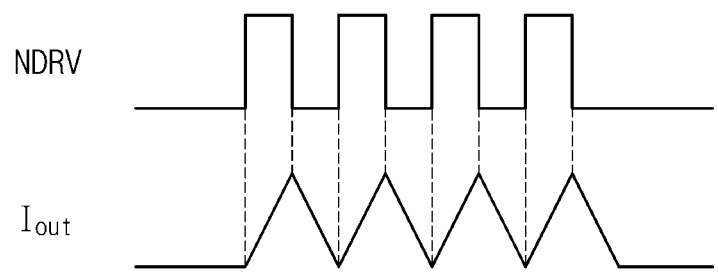
FIG. 8B is a waveform diagram showing waveforms of the control signal converted by the sensing circuit and the output current converted by the sensing circuit.

FIG. 8A is a waveform diagram showing waveforms of the control signal NDRV provided to the low side driver 411, and of the output current Iout output from the high side driver 412 in the discontinuous conduction mode DCM. FIG. 8B is a waveform diagram showing waveforms of the control signal NDRV, and of the output current Iout, which are converted by the sensing circuit 420.

When it is determined that the power management circuit 400 supplies the power in the discontinuous conduction mode DCM as shown in FIG. 8A, the frequency of the control signal NDRV applied to the first transistor TR1 of the low side driver 411 may become higher as shown in FIG. 8B.

Accordingly, as shown in FIG. 8B, the output current Iout becomes continuous/more continuous/substantially continuous. As shown in FIG. 8A, in the case that the output current Iout is not continuous, the efficiency of the power management circuit 400 becomes lower. Accordingly, when the output current Iout becomes continuous as shown in FIG. 8B, the efficiency of the power management circuit 400 increases.

Although the embodiments of the present invention have been described, it is understood that the present invention should not be limited to these embodiments but various changes and modifications can be made by one ordinary skilled in the art within the spirit and scope of the present invention as hereinafter claimed. Therefore, the disclosed subject matter should not be limited to any single embodiment described herein, and the scope of the present inventive concept shall be determined according to the attached claims.

What is claimed is:

1. A display device comprising:
   a display panel; and
   a power management circuit comprising:
      a switching regulator for supplying a power to the display panel in a discontinuous conduction mode or in a continuous conduction mode; and
      a sensing circuit for sensing whether the switching regulator is operated in the discontinuous conduction mode,
   wherein the switching regulator comprises:
      a comparator for receiving and monitoring the supplied power; and an RS latch for receiving an output signal from the comparator as a reset signal, and wherein the sensing circuit comprises:

a phase lock loop circuit for generating a first clock signal;

a phase delay circuit for receiving the first clock signal and generating a second clock signal having a phase delayed from a phase of the first clock signal;

a first D flip-flop for receiving an output signal from the RS latch and the first clock signal, and for operating at a rising edge;

a second D flip-flop for receiving an output signal from the first D flip-flop and the first clock signal, and for operating at a falling edge;

a third D flip-flop for receiving the output signal from the RS latch and the second clock signal, and for operating at a rising edge;

a fourth D flip-flop for receiving an output signal from the third D flip-flop and the first clock signal, and for operating at a falling edge;

an exclusive OR circuit for receiving an output signal from the second D flip-flop and an output signal from the fourth D flip-flop;

a fifth D flip-flop for receiving an output signal from the exclusive OR circuit and a third clock signal having a frequency that is lower than a frequency of the first clock signal;

a plurality of registers for sequentially storing signals output from the fifth D flip-flop; and a control circuit for controlling the phase lock loop circuit based on data stored in the registers.

2. The display device of claim 1, wherein the sensing circuit further comprises a decoder to control the registers.

3. The display device of claim 1, wherein the RS latch is configured to receive the first clock signal as a set signal.

4. The display device of claim 3, wherein a frequency of the output signal from the RS latch is equal to the frequency of the first clock signal.

5. The display device of claim 1, wherein the phase lock loop circuit comprises:

a voltage controlled oscillator;

a divider for receiving an output signal from the voltage controlled oscillator;

a phase frequency detector for receiving an output signal from the divider;

a charge pump for receiving an output signal from the phase frequency detector; and a low pass filter for applying only a frequency band of an output signal of the charge pump to the voltage controlled oscillator.

6. The display device of claim 5, wherein the control circuit is configured to apply a control signal to the divider.

7. The display device of claim 1, wherein the control circuit is configured to determine that the switching regulator is operated in the discontinuous conduction mode when each of the registers stores the data having a high value, and is configured to determine that the switching regulator is operated in the continuous conduction mode when each of the registers stores the data having a low value.

8. The display device of claim 7, wherein, when the control circuit determines that the switching regulator is operated in the discontinuous conduction mode, the frequency of the first clock signal increases.

9. The display device of claim 1, wherein the control circuit is configured to apply a control signal to the phase delay circuit to control a difference in phase between the first clock signal and the second clock signal.

10. The display device of claim 1, wherein the output signal of the RS latch has a pulse width that is smaller than a difference in phase between the first clock signal and the second clock signal in the discontinuous conduction mode.

11. A power management circuit comprising:

a switching regulator for supplying a power to an external device in a discontinuous conduction mode or in a continuous conduction mode; and a sensing circuit for sensing whether the switching regulator is operated in the discontinuous conduction mode, wherein the switching regulator comprises:

a comparator for receiving the supplied power to feedback the supplied power; and an RS latch for receiving an output signal from the comparator as a reset signal, and wherein the sensing circuit comprises:

a phase lock loop circuit for generating a first clock signal;

a phase delay circuit for receiving the first clock signal, and for generating a second clock signal having a phase delayed from a phase of the first clock signal;

a first D flip-flop for receiving an output signal from the RS latch and the first clock signal, and operating at a rising edge;

a second D flip-flop for receiving an output signal from the first D flip-flop and the first clock signal, and for operating at a falling edge;

a third D flip-flop for receiving the output signal from the RS latch and the second clock signal, and for operating at a rising edge;

a fourth D flip-flop for receiving an output signal from the third D flip-flop and the first clock signal, and for operating at a falling edge;

an exclusive OR circuit for receiving an output signal from the second D flip-flop and an output signal from the fourth D flip-flop;

a fifth D flip-flop for receiving an output signal from the exclusive OR circuit and a third clock signal having a frequency that is lower than a frequency of the first clock signal;

a plurality of registers for sequentially storing signals output from the fifth D flip-flop; and a control circuit for controlling the phase delay circuit based on data stored in the registers.

12. The power management circuit of claim 11, wherein the sensing circuit further comprises a decoder to control the registers.

13. The power management circuit of claim 11, wherein the RS latch is configured to receive the first clock signal as a set signal.

14. The power management circuit of claim 13, wherein a frequency of the output signal from the RS latch is equal to the frequency of the first clock signal.

15. The power management circuit of claim 11, wherein the phase lock loop circuit comprises:

a voltage controlled oscillator;

a divider for receiving an output signal from the voltage controlled oscillator;

a phase frequency detector for receiving an output signal from the divider;

a charge pump for receiving an output signal from the phase frequency detector; and a low pass filter for applying only a frequency band of an output signal of the charge pump to the voltage controlled oscillator.

16. The power management circuit of claim 15, wherein the control circuit is configured to apply a control signal to the divider.

17. The power management circuit of claim 11, wherein the control circuit is configured to determine that the switching regulator is operated in the discontinuous conduction mode when each of the registers stores the data having a high value, and is configured to determine that the switching regulator is operated in the continuous conduction mode when each of the registers stores the data having a low value.

18. The power management circuit of claim 17, wherein, when the control circuit determines that the switching regulator is operated in the discontinuous conduction mode, the frequency of the first clock signal increases.

19. The power management circuit of claim 11, wherein the control circuit is configured to apply a control signal to the phase delay circuit to control a difference in phase between the first clock signal and the second clock signal.

20. A display device comprising:
a display panel; and
a power management circuit comprising a switching regulator for supplying a power to the display panel in a discontinuous conduction mode or in a continuous conduction mode, and a sensing circuit for sensing whether the switching regulator is operated in the discontinuous conduction mode,
wherein the switching regulator comprises:
a comparator for receiving and monitoring the supplied power; and
an RS latch for receiving an output signal from the comparator as a reset signal, and
wherein the sensing circuit comprises:
a phase lock loop circuit for generating a first clock signal;
a phase delay circuit for receiving the first clock signal, and for generating a second clock signal having a phase delayed from a phase of the first clock signal; and
a determination circuit for receiving the first clock signal, the second clock signal, and an output signal from the RS latch, for outputting a first value when a pulse width of the output signal from the RS latch is smaller than a reference value, and for outputting a second value, which is different from the first value, when the pulse width of the output signal from the RS latch is greater than the reference value.

* * * * *